(12) United States Patent
Chung

(10) Patent No.: US 9,324,849 B2
(45) Date of Patent: Apr. 26, 2016

(54) STRUCTURES AND TECHNIQUES FOR USING SEMICONDUCTOR BODY TO CONSTRUCT SCR, DIAC, OR TRIAC

(71) Applicant: Shine C. Chung, San Jose, CA (US)

(72) Inventor: Shine C. Chung, San Jose, CA (US)

(*) Notice: Subject to any disclaimer, the term of this patent is extended or adjusted under 35 U.S.C. 154(b) by 130 days.

(21) Appl. No.: 13/678,544

(22) Filed: Nov. 15, 2012

(65) Prior Publication Data

US 2014/0131764 A1    May 15, 2014

Related U.S. Application Data

(60) Provisional application No. 61/560,159, filed on Nov. 15, 2011.

(51) Int. Cl.

| | | |
|---|---|---|
| *H01L 21/00* | (2006.01) | |
| *H01L 29/747* | (2006.01) | |
| *H01L 29/66* | (2006.01) | |
| *H01L 29/739* | (2006.01) | |
| *H01L 29/74* | (2006.01) | |
| *H01L 29/861* | (2006.01) | |
| *H01L 29/16* | (2006.01) | |
| *H01L 29/06* | (2006.01) | |
| *H01L 27/02* | (2006.01) | |

(52) U.S. Cl.
CPC ............. *H01L 29/747* (2013.01); *H01L 29/16* (2013.01); *H01L 29/6609* (2013.01); *H01L 29/66386* (2013.01); *H01L 29/7391* (2013.01); *H01L 29/7432* (2013.01); *H01L 29/861* (2013.01); *H01L 29/8611* (2013.01); *H01L 27/0262* (2013.01); *H01L 29/0692* (2013.01)

(58) Field of Classification Search
CPC ............. H01L 29/747; H01L 29/7391; H01L 29/7432; H01L 29/861; H01L 29/16; H01L 29/6609; H01L 29/8611; H01L 29/66386; H01L 27/0262; H01L 29/0692
USPC ........................................... 257/119, 49, 605
See application file for complete search history.

(56) References Cited

U.S. PATENT DOCUMENTS

| | | | |
|---|---|---|---|
| 3,198,670 | A | 8/1965 | Nissim |
| 3,715,242 | A | 2/1973 | Daniel |
| 4,148,046 | A | 4/1979 | Hendrickson et al. |
| 4,192,059 | A | 3/1980 | Khan et al. |

(Continued)

FOREIGN PATENT DOCUMENTS

| | | |
|---|---|---|
| CN | 1469473 A | 1/2004 |
| CN | 1691204 A | 11/2005 |

(Continued)

OTHER PUBLICATIONS

Office Action for U.S. Appl. No. 14/101,125, mailed Mar. 6, 2015.

(Continued)

*Primary Examiner* — Laura Menz

(57) ABSTRACT

Switch devices, such as Silicon Controlled Rectifier (SCR), DIAC, or TRIAC, on a semiconductor body are disclosed. P/N junctions can be built on a semiconductor body, such as polysilicon or active region body on an insulated substrate, with a first implant in one end and a second implant in the other end. The first and second implant regions are separated with a space. A silicide block layer can cover the space and overlap into both implant regions to construct P/N junctions in the interface.

25 Claims, 12 Drawing Sheets

(56) References Cited

U.S. PATENT DOCUMENTS

| | | |
|---|---|---|
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A | 5/1998 | Fujihira et al. |
| 5,761,148 A | 6/1998 | Allan et al. |
| 5,962,903 A | 10/1999 | Sung et al. |
| 6,002,156 A | 12/1999 | Lin |
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimormura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,388,292 B1 | 5/2002 | Lin |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,211,843 B2 | 5/2007 | Low et al. |
| 7,212,432 B2 | 5/2007 | Ferrant et al. |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,808,815 B2 | 10/2010 | Ro et al. |
| 7,830,697 B2 | 11/2010 | Herner |
| 7,833,823 B2 | 11/2010 | Klersy |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,699,259 B2 | 4/2014 | Zhang et al. |
| 8,760,904 B2 | 6/2014 | Chung |
| 8,817,563 B2 | 8/2014 | Chung |
| 8,830,720 B2 | 9/2014 | Chung |
| 8,854,859 B2 | 10/2014 | Chung |
| 8,861,249 B2 | 10/2014 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0175060 A1 | 7/2008 | Liu et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2009/0055617 A1 | 2/2009 | Bansal et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0128772 A1 | 6/2011 | Kim et al. |
| 2011/0145777 A1 | 6/2011 | Iyer et al. |
| 2011/0175199 A1* | 7/2011 | Lin et al. ................ 257/605 |
| 2011/0222330 A1 | 9/2011 | Lee et al. |
| 2011/0260289 A1 | 10/2011 | Oyamada |
| 2011/0297912 A1 | 12/2011 | Samachisa et al. |
| 2011/0310655 A1 | 12/2011 | Kreupl et al. |

(56) References Cited

U.S. PATENT DOCUMENTS

| | | |
|---|---|---|
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0308366 A1 | 11/2013 | Chung |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |

FOREIGN PATENT DOCUMENTS

| | | |
|---|---|---|
| CN | 101083227 A | 5/2007 |
| CN | 101057330 A | 10/2007 |
| CN | 101188140 A | 5/2008 |
| CN | 101271881 A | 9/2008 |
| CN | 101483062 A | 7/2009 |
| CN | 101728412 A | 6/2010 |
| EP | 1367596 A1 | 12/2003 |
| JP | 03-264814 | 11/1991 |
| TW | I309081 | 4/2009 |

OTHER PUBLICATIONS

Hassan, "Argument for anti-fuse non-volatile memory in 28nm high-k metal gate", Feb. 15, 2011, wwwl.eeetimes.com publication.

Office Action for U.S. Appl. No. 13/026,783, mailed on Mar. 5, 2015.

Final Office Action for U.S. Appl. No. 13/678,539, mailed Apr. 1, 2015.

Office Action for U.S. Appl. No. 14/636,155, mailed on Apr. 10, 2015.

Notice of Allowance for U.S. Appl. No. 14/021,990, mailed Apr. 14, 2015.

Notice of Allowance for U.S. Appl. No. 13/842,824, mailed Apr. 14, 2015.

Notice of Allowance for U.S. Appl. No. 14/071,957, mailed Apr. 14, 2014.

Notice of Allowance for U.S. Appl. No. 14/231,404, mailed Apr. 17, 2015.

Notice of Allowance for U.S. Appl. No. 13/590,444, mailed May 12, 2015.

Notice of Allowance for U.S. Appl. No. 13/072,783, mailed May 13, 2015.

Notice of Allowance for U.S. Appl. No. 13/833,067, mailed Jun. 5, 2015.

Office Action for U.S. Appl. No. 13/314,444, mailed Dec. 10, 2014.
U.S. Appl. No. 13/471,704, filed May 15, 2012.
U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,541, filed Nov. 15, 2012.
U.S. Appl. No. 13/678,543, filed Nov. 15, 2012.

Ahn, S.J. et al, "Highly Reliable 50nm Contact Cell Technology for 256Mb PRAM," IEEE VLSI Tech Symp., Jun. 2005, pp. 98-99.

Alavi, Mohsen, et al., "A PROM Element Based on Salicide Allgomeration of Poly Fuses in a CMOS Logic Process," IEEE IEDM, 97, pp. 855-858.

Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.

Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.

Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.

(56) References Cited

OTHER PUBLICATIONS

Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.

Banerjee, Kaustav et al., "High Current Effects in Silicide Films for Sub-0.25um VLSI Technologies," IEEE 36th IRPS, 1998, pp. 284-292.

Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.

Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.

Bedeschi, F. et al., "A Fully Symmetrical Sense Amplifier for Non-volatile Memories," IEEE. Int. Symp. on Circuits and Systems, (ISCAS), vol. 2, 2004, pp. 625-628.

Bedeschi, F. et al., "An 8Mb Demonstrator for High-Density 1.8V Phase-Change Memories," VLIS Cir. Symp, Jun. 2004, pp. 442-445.

Bedeschi, F. et al., "SET and RESET Pulse Characterization in BJT-Selected Phase-Change Memory," IEEE Int. Symp. on Circuits and Systems (ISCAS), 2005, pp. 1270-1273.

Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

Cagli, C. et al., "Evidence for threshold switching in the set process of NiO-based RRAM and physical modeling for set, reset, retention and disturb prediction," IEEE IEDM, 2008, pp. 1-4.

Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.

Chan, Wan Tim, et al., "CMOS Compatible Zero-Mask One Time Programmable Memory Design", Master Thesis, Hong-Kong University of Science and Technologies, 2008.

Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.

Cheng, Yu-Hsing et al., "Failure Analysis and Optimization of Metal Fuses for Post Package Trimming," IEEE 45th IRPS, 2007, pp. 616-617.

Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.

Cho, Woo Yeong et al., "A 0.18um 3.0V 64Mb Non-Volatile Phase-Transition Random-Access Memory (PRAM)," ISSCC, Feb. 2004, Sec. 2-1.

Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.

Choi, Youngdon et al., "A 20nm 1.8V 8Gb PRAM with 40MB/s Program Bandwidth," IEEE ISSCC, 2012, pp. 46-47.

Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.

Chung, S. et al., "A 512x8 Electrical Fuse Memory with 15um2 Cells Using 8-sq Asymmetrical Fuse and Core Devices in 90nm CMOS," VLSI Cir. Symp., Jun. 2007, pp. 74-75.

Crowley, Matthew et al., "512Mb PROM with 8 Layers of Antifuse/Diode Cells," IEEE ISSCC 2003, Sec. 16.4.

De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.

De Sandre, Guido et al., "A 90nm 4Mb Embedded Phase-Change Memory with 1.2V 12ns Read Access Time and 1MB/s Write Throughput," ISSCC 2010, Sec. 14.7.

Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.

Dion, Michael J., "Reservoir Modeling for Electromigration Improvement of Metal Systems with Refractory Barriers," IEEE 39th IRPS, 2001, pp. 327-333.

Doorn, T. S. et al., "Ultra-fast Programming of Silicided Polysilicon Fuses Based on New Insights in the Programming Physics," IEEE IEDM, 2005, pp. 667-670.

Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.

Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.

Engel, B. et al., "The Science and Technology of Magnetoresistive Tunnel Memory," IEEE Tran. on Nanotechnology, vol. 1, No. 1, Mar. 2002, pp. 32-38.

Engel, B.N. et al., "A 4Mb Toggle MRAM Based on a Novel bit and Switching Method," IEEE Trans. on Mag. vol. 41, No. 1, Jan. 2005, pp. 132-136.

Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using a New Material-Oriented Methodology," IEEE VLSI Tech. Symp., Jun. 2009, pp. 30-31.

Gao, B. et al., "Oxide-Based RRAM Switching Mechanism: A New Ion-Transport-Recombination Model," IEDM, Dec. 2008, pp. 563-566.

Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.

Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology," 7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

Kang, Han-Byul et al., "Electromigration of NiSi Poly Gated Electrical Fuse and Its Resistance Behaviors Induced by High Temperature," IEEE IRPS, 2010, pp. 265-270.

Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.

(56) References Cited

OTHER PUBLICATIONS

Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.

Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.

Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.

Kim, Deok-Kee et al., "An Investigation of Electrical Current Induced Phase Transitions in the NiPtSi/Polysilicon System," J. App. Phy. 103, 073708 (2008).

Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

Kim, Jinbong et al., "3-Transistor Antifuse OTP ROM Array Using Standard CMOS Process," IEEE VLSI Cir. Symposium, Jun. 2003, pp. 239-242.

Kim, O. et al., "CMOS trimming circuit based on polysilicon fusing," Elec. Lett. vol. 34, No. 4, pp. 355-356, Feb. 1998.

Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.

Kothandaramam, C. et al., "Electrically programmable fuse (eFUSE) using electromigration in silicides," IEEE Elec. Dev. Lett., vol. 23, No. 9, pp. 523-525, Sep. 2002.

Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.

Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol. 45, No. 4, Apr. 2010, pp. 863-868.

Kund, Michael et al., "Conductive Bridging RAM (CBRAM): An Emerging Non-Volatile Memory Technology Scalable to Sub 20nm," IEEE IEDM 2005, pp. 754-757.

Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.

Lai, S., "Current Status of the Phase Change Memory and Its Future," IEEE IEDM Dig. of Tech. Paper, Dec. 2003, pp. 255-258.

Lee, H.Y. et al., "Low Power and High Speed Bipolar Switching with a Thin Reactive Ti Buffer Layer in Robust HfO2 Based RRAM," IEEE IEDM, 2008, pp. 1-4.

Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

Lee, M.-J. et al., "Stack Friendly all-Oxide 3D RRAM Using GaInZnO Peripheral TFT Realized Over Glass Substrates," IEDM, Dec. 2008. pp. 1-4.

Lee, Man Chiu et al., "OTP Memory for Low Cost Passive RFID Tags," IEEE Conf. on Electron Devices and Solid-State Circuits (EDSSC), 2007, pp. 633-636.

Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.

Morimoto, T. et al., "A NiSi Salicide Technology for Advanced Logic Devices," IEEE IEDM, Dec. 1991, pp. 653-656.

Neale, Ron, "PCM Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al., "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE IEDM Dig. of Tech. Paper, Dec. 2006, pp. 1-4.

Osada, K. et al., "Phase Change RAM Operated with 1.5V CMOS as Low Cost Embedded Memory," IEEE CICC, Nov. 2005, pp. 431-434.

Park, Don et al., "Study on Reliability of Metal Fuse for Sub-100nm Technology," IEEE Int. Symp. on Semiconductor Manufacturing (ISSM), 2005, pp. 420-421.

Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.

Park, Young-Bae et al., "Design of an eFuse OTP Memory of 8 Bits Based on a 0.35um BCD Process," Mobile IT Convergence (ICMIC), 2011 Int. Conf. on, pp. 137-139.

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.

Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.

Rizzolo, R. F. et al., "IBM System z9 eFUSE applications and methodology," IBM J. Res. & Dev. vol. 51 No. ½ Jan./Mar. 2007, pp. 65-75.

Robson, Norm et al., "Electrically Programmable Fuse (eFuse) from Memory Redundancy to Autonomic Chips," IEEE CICC, 2007, pp. 799-804.

Russo, U. et al., "Conductive-Filament Switching Analysis and Self-Accelerated Thermal Dissolution Model for Reset in NiO-based RRAM," IEDM, Dec. 2007, pp. 775-778.

Safran, J. et al., "A Compact eFUSE Programmable Array Memory for SOI CMOS," VLSI Cir. Symp. Jun. 2007, pp. 72-73.

Sasaki, Takahiko et al., "Metal-Segregate-Quench Programming of Electrical Fuse," IEEE 43rd IRPS, 2005, pp. 347-351.

Schrogmeier, P. et al., "Time Discrete Voltage Sensing and Iterative Programming Control for a 4F2 Multilevel CBRAM," VLSI Cir. Symp., Jun. 2007, pp. 186-187.

Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.

Sheu, Shyh-Shyuan et al., "Fast-Write Resistive RAM (RRAM) for Embedded Applications," IEEE Design & Test of Computers, Jan./Feb. 2011, pp. 64-71.

Shi, Min et al., "Zero-Mask Contact Fuse for One-Time-Programmable Memory in Standard CMOS Processes," IEEE Dev. Lett. vol. 32, No. 7, Jul. 2011, pp. 955-957.

(56) References Cited

OTHER PUBLICATIONS

Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.
Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.

(56) References Cited

OTHER PUBLICATIONS

Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo. cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-µ m shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.

(56) References Cited

OTHER PUBLICATIONS

Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.

* cited by examiner

STRUCTURES AND TECHNIQUES FOR USING SEMICONDUCTOR BODY TO CONSTRUCT SCR, DIAC, OR TRIAC

CROSS-REFERENCE TO RELATED APPLICATIONS

This application claims priority benefit of U.S. Provisional Patent Application No. 61/560,159, filed on Nov. 15, 2011 and entitled "Using Ring-Shape Polysilicon Diodes for Electro-Static Discharge (ESD) Protection," which is hereby incorporated herein by reference

BACKGROUND OF THE INVENTION

1. Field of the Invention

The present invention relates to Electro-Static Discharge (ESD) protection, i.e. using mechanism, device, circuit, apparatus, or any means to protection an integrated circuit from ESD damages.

2. Description of the Related Art

Human bodies may carry a lot of electrostatic charges. When an integrated circuit is touched by a human bodies during handling, a very high voltage (~5 KV) and a high current (~2 A) may be generated that can damage a delicate integrated circuit. The high voltage generated may breakdown MOS gate oxides, and the high power generated by high current may damage the metallurgical junctions. To protect an integrated circuit from ESD damages, the high voltage must be clamped, the high current must be limited, and the high heat generated from the high power consumption must be quickly dissipated to protect against temperature damage.

ESD protection becomes more important in today's semiconductor industry for several reasons. Firstly, as gate oxide of the MOS devices becomes thinner, it becomes more vulnerable to ESD damages due to aggressive scaling. Secondly, the threshold voltage of MOS devices in the core logic is lower from 0.7V to about 0.4V, and the breakdown voltage is lower from 5-7V to about 3-4V that can easily escape from the junction diodes' protection. Thirdly, high speed and high frequency circuits in an integrated circuit require very small input capacitance and yet good ESD protection. However, good ESD protection often requires large silicon area and high input capacitance. Therefore, the ESD protection issues deserve revisiting in today's nanometer devices.

FIG. 1 shows a prior art ESD protection device 10 that has an I/O pad 13 protected by two junction diodes 12 and 11. The P terminal of the diode 12 is coupled to VSS and the N terminal is coupled to the I/O pad 13. Similarly, the P terminal of the diode 11 is coupled to the I/O pad 13 and the N terminal is coupled to the VDD. The junction diodes 12 and 11 have a turn-on voltage of about 0.7V and a breakdown voltage of about 5V, for example. When a high positive voltage is applied to the I/O pad 13, the I/O pad 13 can be clamped to VDD+0.7 if the diode 11 is turned on and can be clamped to 5V, if the diode 12 is broken down. Similarly, when a high negative voltage is applied to the I/O pad 13, the I/O pad can be clamped to −0.7V if the diode 12 is turned on and can be clamped to VDD-5V if the diode 11 is broken down. Thus, the high voltage of ~3 KV can be clamped to a very low voltage. The high heat generated by the high current during diode turn-on or breakdown can be quickly dissipated by guard rings surrounding the P terminal or N terminal of the diodes. The area of the diodes tends to be very large for better ESD immunity, but the large area is relatively costly.

FIG. 2 shows a conventional ESD protection device 20 for CMOS technologies that has an I/O pad 23 protected by two MOS devices connected as diodes 22 and 21. The P terminal of the diode 22 is coupled to VSS and the N terminal is coupled to the I/O pad 23. Similarly, the P terminal of the diode 21 is coupled to the I/O pad 23 and the N terminal is coupled to the VDD. The MOS diodes 22 and 21 have a turn-on voltage of about 0.6-0.7V and a breakdown voltage of about 4-5V depending on the MOS technologies. When a high positive voltage is applied to the I/O pad 23, the I/O pad 23 can be clamped to VDD+0.7, if the diode 21 is turned on and can be clamped to 5V if the diode 22 is broken down. Similarly, when a high negative voltage is applied to the I/O pad 23, the I/O pad can be clamped to −0.7V if the diode 22 is turned on and can be clamped to VDD-5V if the diode 21 is broken down. Thus, the high voltage of ~3 KV can be clamped to a very low voltage. Other than the MOS connected as diodes to protect integrated circuits, the junction diodes in source/drain of the MOS devices 21 and 22 can also serve for protection. In other embodiments, the ESD protection can be based on source/drain of the MOS 21 and 22 while the gates of the MOS 21 and 22 are configured as output drivers.

A diode can be fabricated from polysilicon. FIG. 3(a) shows a cross section of a polysilicon diode. To form a polysilicon diode, a polysilicon is implanted by N+ at one end and P+ at the other end with a spacing Lc in between that has intrinsic doping level. The intrinsic doping level only means not intentionally doped with any dopants but can be slightly N type or P type due to out diffusion or contamination. A silicide block layer is applied to block silicide formation on the surface of the polysilicon to thus prevent a short circuit. The two ends of P+ and N+ in polysilicon are further brought out as P and N terminals of a diode through contacts, vias, or metals. As an example of a polysilicon diode, see Ming-Dou Ker et al., "Ultra High-Voltage Charge Pump Circuit in Low-Voltage Bulk CMOS Processes with Polysilicon Diodes," IEEE Transaction of Circuit and System-II, Vol. 54, No. 1, January 2007, pp. 47-51.

FIG. 3(b) shows current verses voltage characteristics of a polysilicon diode, such as shown in FIG. 3(a). The current verses voltage curves show useful diode behavior such as a threshold voltage of about 0.6V and a leakage current of less than 1 nA. By varying the spacing Lc, the breakdown voltage and leakage current of the polysilicon diode can be adjusted accordingly.

Polysilicon diodes can be used for ESD protection, refer to Ming-Dou Ker et al, "High-Current Characterization of Polysilicon Diode for Electrostatic Discharge Protection in Sub-Quarter-Micron Complementary Metal Oxide Semiconductor Technology," Jpn. J. Appl. Phys. Vol. 42, 2003, pp. 3377-3378. Polysilicon structures for ESD protection in the prior arts are about a one-piece rectangular structure, which has rooms for improvements. Thus, there is still a need to use an optimized polysilicon diode structure to achieve higher ESD voltage, lower input capacitance, smaller area, and lower heat generated in today's giga-Hertz circuits.

SUMMARY

Embodiments of ESD protection using ring structures of diodes are disclosed. The diodes constructed from polysilicon or active region body on insulated substrate can be fabricated from standard bulk or SOI CMOS logic processes to achieve high ESD immunity, low input capacitance, small I/O size and low cost.

In one embodiment, the ESD protection can be constructed from diodes in ring structures that can be comparable to the I/O pad size and/or can be hidden underneath the pad partially or wholly. The diodes can be constructed from at least one polysilicon structure, insulated active region in SOI process, or junction diode in standard CMOS process. One ring-shape diode has the P terminal coupled to the pad and the N terminal coupled to VDD. The other ring-shape diode has the P terminal coupled to the VSS and the N terminal coupled to the pad. There can be a plurality of ring-shape structures and can be placed in concentric manner to maximize the ESD performance in small size. The contour of the diodes can be in circle, polygon or other shapes. In one embodiment, the P or N terminal of the ring-shape diodes is coupled to VDD, VSS, or pad through Active Areas (AAs) so that the heat generated can be quickly dissipated. Advantageously, the same diode structure can be used to create CMOS gates, sources, drains, or interconnects in standard CMOS logic processes. The input capacitance using ring-shape diodes can be smaller than that in the conventional junction diodes or MOS connected as diodes for the same ESD performance. Particularly, the turn-on voltage of polysilicon diodes is about 0.6V, smaller than 0.7V of junction diodes. The breakdown voltage of the polysilicon or active-region diodes can be easily changed by adjusting the spacing of the P+ and N+ implants or the doping concentration in the space between P+ and N+ implants. Thus, high performance and low cost ESD protection can be realized.

The invention can be implemented in numerous ways, including as a method, system, device, or apparatus (including graphical user interface and computer readable medium). Several embodiments of the invention are discussed below.

As a switch device built on a semiconductor body, one embodiment can, for example, include at least: at least three regions in a portion of the semiconductor body, the first and the third regions being implanted with a first type of dopant, the second region being implanted with a second type of dopant, and the regions being adjacent are separated by spaces; and a silicide block layer (SBL) covering the spaces and overlapping into both implant regions to construct P/N junctions between the first/second and second/third regions. The first and third implant regions can be conductive when a sufficiently high voltage is applied between the first and third implant regions.

As an electronic system, one embodiment can, for example, include at least one integrated circuit including at least one switch device on a semiconductor body. The switch device includes at least: at least three implant regions provided on a portion of the semiconductor body, the first and third implant regions being with a first type of implant, the second implant region being with a second type of implant, and the implant regions being adjacent are separated by at least one space; and at least one silicide block layer (SBL) covering the at least one space and overlapping into the adjacent implant regions to construct P/N junctions in first/second and second/third implant regions.

As a method for providing a switch device on a semiconductor body, one embodiment can, for example, include at least: forming at least three regions in the semiconductor body, the first and the third regions being with a first type of implant and the second region being with a second type of implant, where adjacent ones of the implant regions are separated with a space; and forming a silicide block layer covering the space and overlapping into both of the adjacent implant regions to construct P/N junctions between first/second and second/third regions.

As an ESD device, one embodiment can, for example, include a plurality of ESD protection rings. At least one of the ESD protection rings can include at least one diode with P terminal coupled to the pad and the N terminal coupled to the VDD and at least another diode with P terminal coupled to the VSS and the N terminal coupled to the pad. The diode can be on a polysilicon or active-region body on an insulated substrate. The diode can also be a junction diode on a silicon substrate. Alternatively, the diode can have the P+ and N+ implant regions in the inner or outer part of a concentric ring. The P+ and N+ regions can be separated with a space, and a silicide block layer (SBL) can cover the space and overlap into both implant regions to construct P and N terminals of a diode. The P+ and N+ regions can be isolated by LOCOS (LOCal Oxidation), STI (Shallow Trench Isolation), dummy gate, or SBL in a junction diode on silicon substrate. In addition, the P and N terminals of the diodes coupled to VDD, VSS, or pad can be through contacts or vias to metals and/or through active areas to a thermally conductive substrate.

As an electronic system, one embodiment of the invention can, for example, include at least one Print Circuit Board (PCB), and at least one integrated circuit operatively connected to the PCB. The integrated circuit can include at least an I/O pad and at least one ESD protection structures. At least one of the ESD protection structures can include a ring-shape diode structure that has at least one diode with the P terminal coupled to the I/O pad and the N terminal coupled to the VDD and/or another diode with the P terminal coupled to the VSS and the N terminal coupled to the I/O pad. The diode can be on a polysilicon or active-region body on an insulated substrate. The diode can also be a junction diode on a silicon substrate. Alternatively, the P+ and N+ implant regions of the diode can be separated with a space (or isolation), such as LOCOS, STI, or dummy gate, and a silicide block layer can cover the space and overlap into both implant regions to construct P and N terminals of a diode, respectively. Also, the P or N terminal of the diodes can be coupled to VDD, VSS, or I/O pads through contacts or vias to metals, and/or through active areas to a thermally conductive substrate. There can be a plurality of ring-shape diode structures and placed in concentric manner. The contour of the diodes can be circle, polygon, or other shapes.

As a method for providing an ESD protection, one embodiment can, for example, include at least providing an ring-shape diode structure, where at least one of the ring-shape diode structures can include at least (i) a ring-shape diode with the P terminal coupled to an I/O pad and the N terminal coupled to a first supply voltage; and/or (ii) a ring-shape diode with the P terminal coupled to a second supply voltage and the N terminal coupled to the I/O pad. The diode can be a polysilicon or active-region body on an insulated substrate, or P/N junction on a silicon substrate. The P or N terminals of the diodes can be coupled to the first/second supply voltages or I/O pads through contacts or vias, to metal, and/or through active areas to a thermally conductive substrate. The embodiment of the invention can also include a plurality of concentric diode rings with the contour being circle, polygon, or other shapes.

Other aspects and advantages of the invention will become apparent from the following detailed description taken in conjunction with the accompanying drawings which illustrate, by way of example, the principles of the invention.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF EMBODIMENTS OF THE INVENTION

Embodiments disclosed herein use an ESD structure with ring-shape diodes. The diodes can comprise P+ and N+ implants on a polysilicon or active region body on an insulated substrate with the P+ and N+ implants separated by a gap. The gap can be covered by a silicide block layer (SBL) and overlapping into both P+ and N+ areas. The diode can also be N+ active region on a P type substrate or P+ active region on an N well. The isolation between the P+ and N+ active regions can, for example, be LOCOS (LOCal Oxidation), STI (Shallow Trench Isolation), dummy gate, or SBL in standard CMOS processes. Since the P+ and N+ implants, active regions, and polysilicon are readily available in standard CMOS logic processes, these devices can be formed in an efficient and cost effective manner. There are no additional masks or process steps to save costs. The ESD protection device can also be included within an electronic system.

Figure 4:
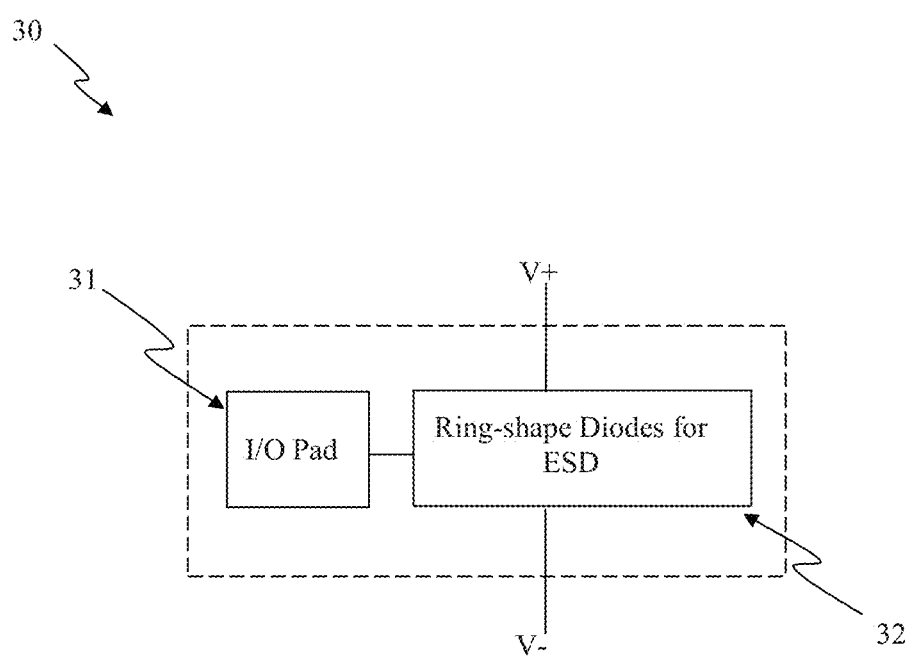
FIG. 4 shows a block diagram of an ESD protection structure using ring-shape diodes and an I/O pad according to one embodiment.

FIG. 4 shows a block diagram of an ESD protection device 30 using at least one ring-shape diodes according to one embodiment. In particular, the ESD protection device 30 includes an I/O pad 31 and at least one ring-shape diode 32. The I/O pad 31 can be coupled to an anode of the diode 32 with the cathode coupled to a high voltage V+, and/or coupled to a cathode of the diode 32 with the anode coupled to a low voltage V−. The couplings between anode(s) or cathode(s) of the diode(s) to external nodes can be through contacts, vias, or metals. In one implementation, the anode(s) and cathode(s) of the diode(s) can be coupled to a thermally conductive substrate through active areas, contacts, vias, or metals. By turning on or breaking down the diodes, a high ESD voltage on the I/O pad can be clamped to diodes' turning or breakdown voltages. Thus the internal devices of an integrated circuit coupled to an I/O pad can be protected from high ESD voltage damage.

Figure 4A:
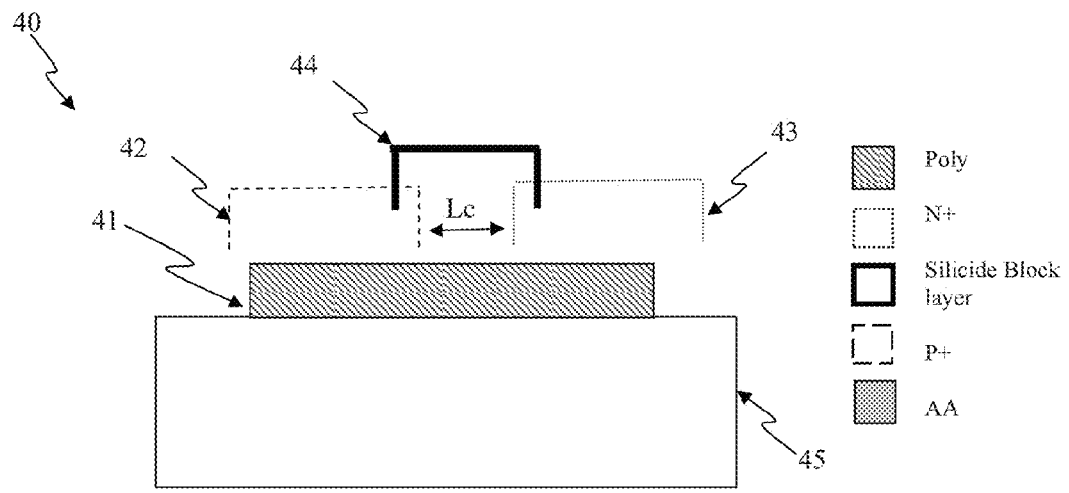
FIG. 4(a) shows a cross section of a polysilicon diode, corresponding to the diodes in FIG. 4, according to one embodiment.

FIG. 4(a) shows a cross section of a polysilicon diode 40, corresponding to the diodes in FIG. 4, according to one embodiment. The polysilicon diode structure 40 has a polysilicon body 41 on an insulated substrate 45 that has a P+ implant 42 in one end and an N+ implant 43 in the other end. The N+ 43 and P+ 42 are separated with a space Lc that can be used to adjust the breakdown voltage of the polysilicon diode. A silicide block layer (SBL) 44 covers the space Lc and overlaps into both P+ and N+ regions 42 and 43 to prevent a short due to silicide grown on the surface of the polysilicon 41. A portion of the N+ 43 and P+ 42 implant areas can be further coupled by contacts, vias, or metals (not shown in FIG. 4(a)) to external nodes as the cathode or anode of the polysilicon diode 40, respectively. The dopant concentration in the space Lc between P+ and N+ regions can be in the intrinsic level, namely, the dopants are not intentionally introduced but can be slightly P type or N type due to out diffusion or contamination. In another embodiment, the dopants in the space can be implanted slightly N or P type to control the resistance of the polysilicon diode 40.

Figure 4B:
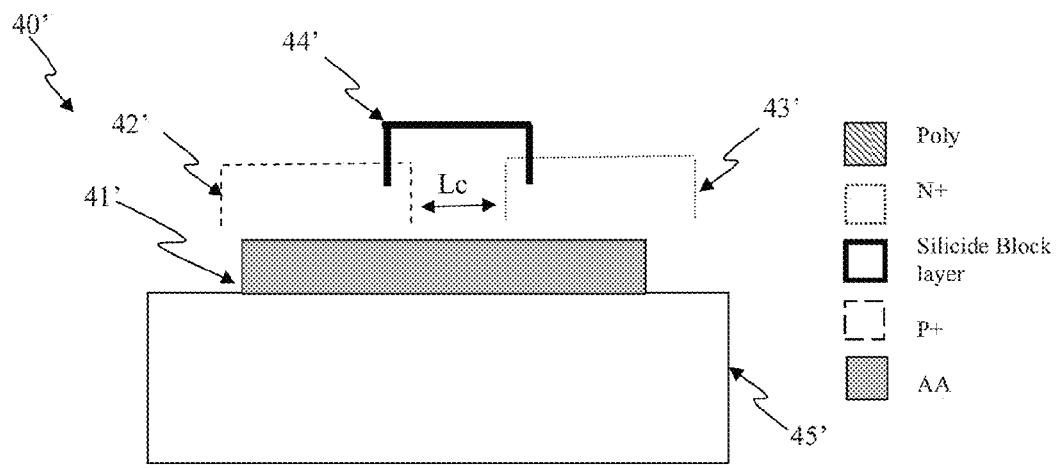
FIG. 4(b) shows a cross section of an active-region diode on an insulated substrate corresponding to the diodes in FIG. 4, according to another embodiment.

FIG. 4(b) shows a cross section of an active-region diode 40' on an insulated substrate 45', corresponding to the diodes in FIG. 4, according to one embodiment. The insulated substrate 45' is, for example, a SOI substrate. The active-region diode 40' has an active-region body 41' on the insulated substrate 45' that has a P+ implant 42' in one end and an N+ implant 43' in the other end. The N+ 43' and P+ 42' are separated with a space Lc that can be used to adjust the breakdown voltage of the active-region diode 40'. A silicide block layer (SBL) 44' covers the space Lc and overlaps into both P+ and N+ regions 42' and 43' to prevent a short due to silicide grown on the surface of the active region 41'. A portion of the N+ 43' and P+ 42' implant areas can be further coupled by contacts, vias, or metals (not shown in FIG. 4(b)) to external nodes as the cathode or anode of the active-region diode 40', respectively. The dopant concentration in the space Lc between P+ and N+ regions can be in the intrinsic level, namely, the dopants are not intentionally introduced but can be slightly P type or N type due to out diffusion or contamination. In another embodiment, the dopants in the space can be implanted slightly N or P type to control the resistance of the active-region diode 40'.

Figure 4C:
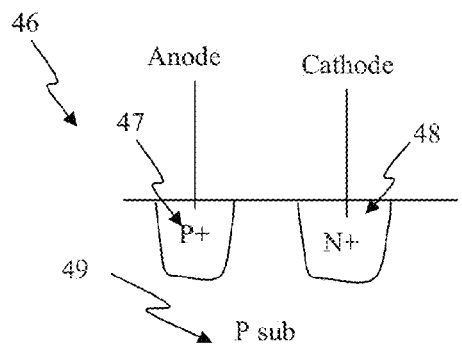
FIG. 4(c) shows a cross section of an active-region diode consisting of an N+ active region on a P substrate, corresponding to the diodes in FIG. 4, according to yet another embodiment.

FIG. 4(c) shows a cross section of an active-region diode 46 on a P type silicon substrate 49, corresponding to the diodes in FIG. 4, according to another embodiment. The active region diode 46 has an anode and a cathode that consist of a P+ active region 47 and an N+ active region 48 on a P type substrate 49. The anode and cathode can be further coupled through contact(s), via(s), or metal(s) (not shown in FIG. 4(c)) as the P and N terminals, respectively, of a diode. The isolation between the P+ 47 and N+ 48 can be LOCS or STI in other embodiment.

Figure 4D:
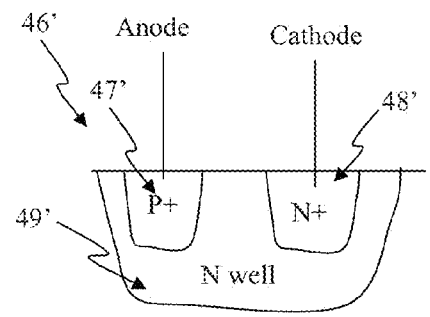
FIG. 4(d) shows a cross section of an active-region diode consisting of P+ active region on an N well, corresponding to the diodes in FIG. 4, according to yet another embodiment.

FIG. 4(d) shows a cross section of an active-region diode 46' with a P+ active region 47' and an N+ active region 48' on an N well 49', corresponding to the diodes in FIG. 4, according to another embodiment. The active region diode 46' has an anode and a cathode that consist of a P+ active region 47' and an N+ active region 48' on an N well 49'. The anode and cathode can be further coupled through contact(s), via(s), or metal(s) (not shown in FIG. 4(d)) as the P and N terminals, respectively, of a diode. The isolation between the P+ 47' and N+ 48' can be LOCS or STI in other embodiment.

Figure 4E:
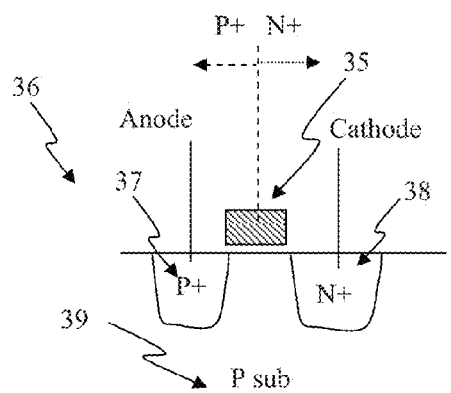
FIG. 4(e) shows a cross section of an active-region diode consisting of an N+ active region on a P substrate with dummy gate isolation, corresponding to the diodes in FIG. 4, according to yet another embodiment.

FIG. 4(e) shows a cross section of an active-region diode 36 on a P type silicon substrate 39, corresponding to the diodes in FIG. 4, according to another embodiment. The active region diode 36 has an anode and a cathode that consist of a P+ active region 37 and an N+ active region 38 on a P type substrate 39. The anode and cathode can be further coupled through contact(s), via(s), or metal(s) (not shown in FIG. 4(e)) as the P and N terminals, respectively, of a diode. The isolation between the anode and cathode can be a dummy gate 35 with part N+ and part P+ implants to create N+ and P+ active regions 38 and 37, respectively. The dummy gate 35 can be coupled to a fixed bias voltage during normal operations. In other embodiment, the dummy gate 35 can be replaced by a silicide block layer for isolation.

Figure 4F:
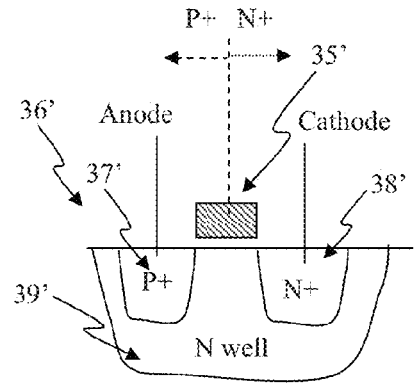
FIG. 4(f) shows a cross section of an active-region diode consisting of P+ active region on an N well with dummy gate isolation, corresponding to the diodes in FIG. 4, according to yet another embodiment.

FIG. 4(f) shows a cross section of an active-region diode 36' with a P+ active region 37' and an N+ active region 38' on an N well 39', corresponding to the diodes in FIG. 4, according to another embodiment. The active region diode 36' has an anode and a cathode that consist of a P+ active region 37' and an N+ active region 38' on an N well 39'. The anode and cathode can be further coupled through contact(s), via(s), or metal(s) (not shown in FIG. 4(f)) as the P and N terminals, respectively, of a diode. The isolation between the anode and cathode can be a dummy gate 35' with part N+ and part P+ implants to create N+ and P+ active regions 38' and 37', respectively. The dummy gate 35' can be coupled to a fixed bias voltage during normal operations. In other embodiment, the dummy gate 35 can be replaced by a silicide block layer for isolation.

Figure 1:
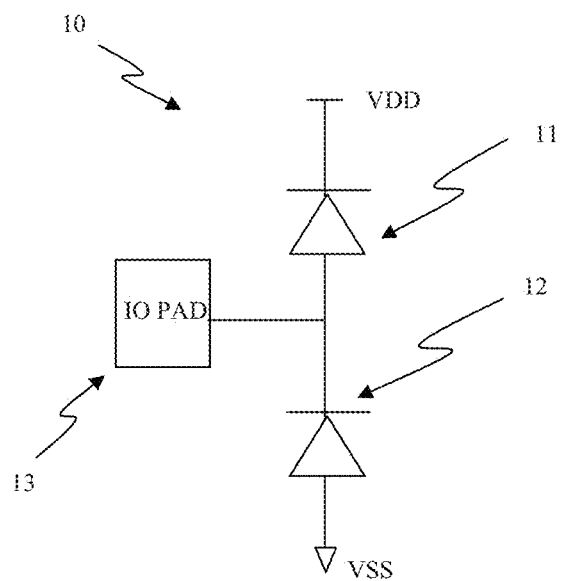
FIG. 1 shows a prior art of ESD protection using diodes.
Figure 2:
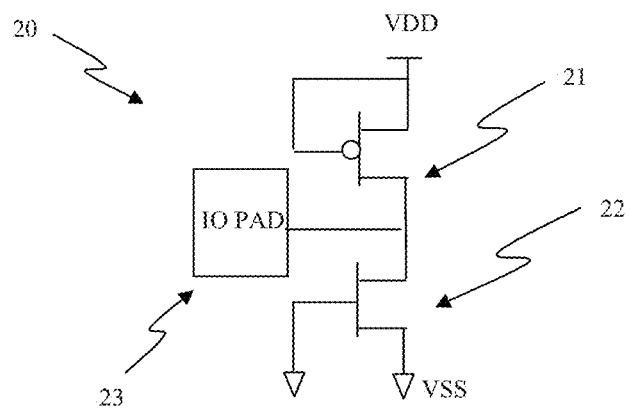
FIG. 2 shows a conventional ESD protection using MOS connected as diodes.
Figure 3A:
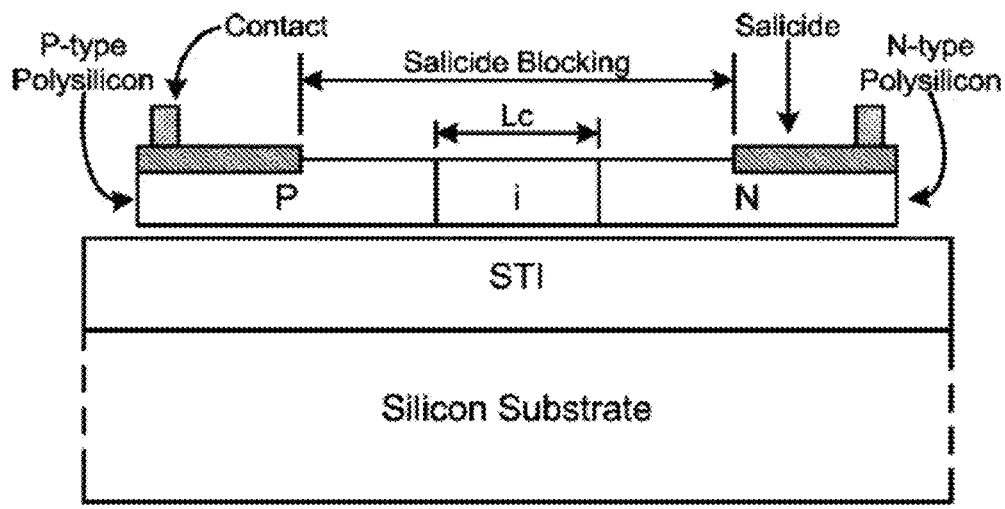
FIG. 3(a) shows a cross section of a polysilicon diode.
Figure 3B:
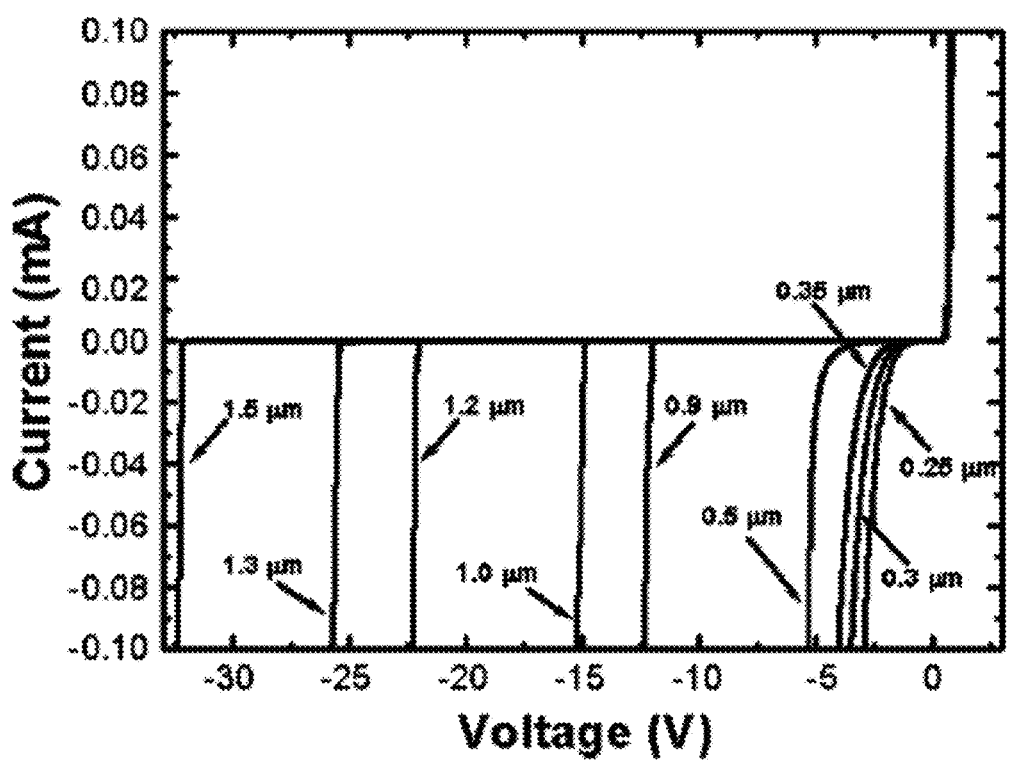
FIG. 3(b) shows current verses voltage characteristics of a polysilicon diode, such as shown in FIG. 3(a).
Figure 5:
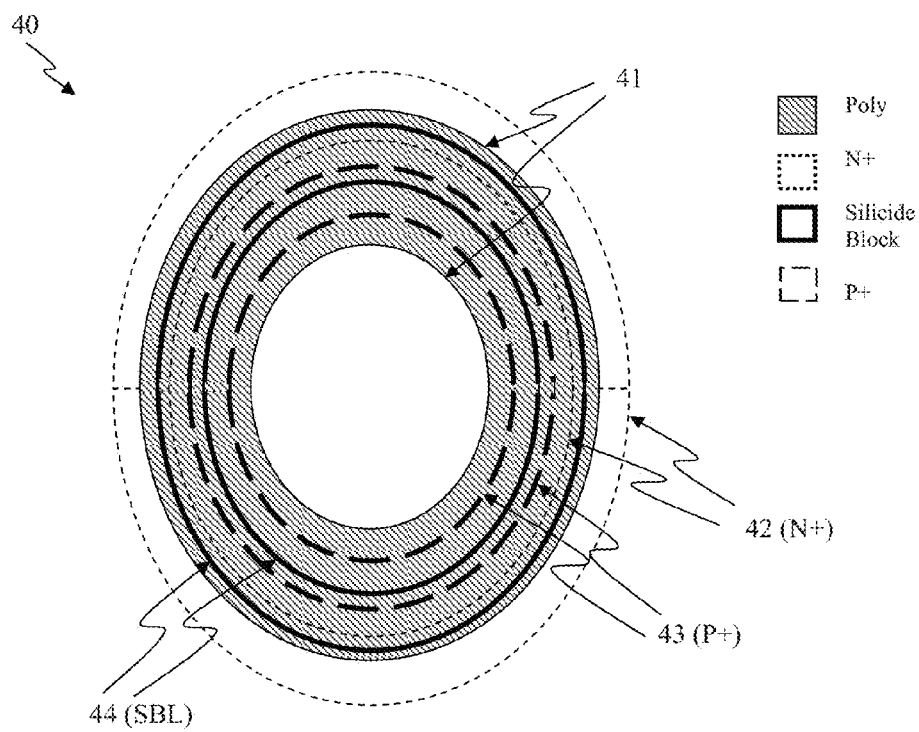
FIG. 5 shows a top view of a ring-shape polysilicon diode according to one embodiment.

FIG. 5 shows a top view of a ring-shape polysilicon diode 40 according to one embodiment. The polysilicon diode structure 40 is similar to the cross section of a polysilicon diode shown in FIG. 3(a) except that the structure is a ring-shape. The circular structure allows uniform electrical field distribution, when a high voltage is applied, to prevent any sharp corners generating high electrical field and causing premature breakdown. The larger the radius of the circle, the lower the electrical field and the lower the current density generated by ESD voltage. The ring 42 is an N+ implant mask to allow heavy N type dopants being implanted into the polysilicon 40. The ring 43 is a P+ implant mask to allow heavy P type dopants to be implanted into the polysilicon 40. A portion of the N+ and P+ implant areas are further coupled by contacts, vias, or metals (not shown in FIG. 5) to external nodes, such as to the cathode or anode of the polysilicon diode 40, respectively. The P+ and N+ areas are preferably separated with a space Lc to adjust the breakdown voltage. The ring 44 is a silicide block layer (SBL) to prevent silicide from growing on the top of the polysilicon and shorting the P+ and N+ regions. The SBL 44 covers the gap between N+ and P+ and preferably overlaps into the P+ and N+ areas. The dopant concentration in the gap between P+ and N+ can be in the intrinsic level, namely, the dopants are not intentionally introduced but can be slightly P type or N type due to out diffusion or contamination. Alternatively, in another embodiment, the dopants in the gap can be implanted slightly N or P to control the resistance. The contour of the polysilicon diode 40 can be a circle, polygon, or other shape in yet another embodiment. The polysilicon diode 40 in FIG. 5 can be applied to an active-region diode built on SOI substrate, or a junction diode built on silicon substrate in other embodiments.

Figure 6:
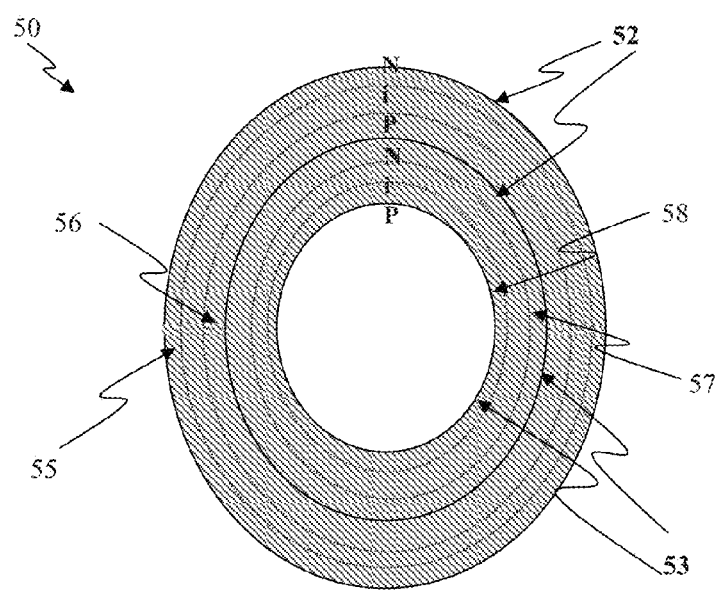
FIG. 6(a) shows a top view of a ring-shape ESD protection structure according to one embodiment.
FIG. 6(b) shows a top view of a ring-shape ESD protection structure according to another embodiment.
FIG. 6(c) shows a top view of a ring-shape ESD protection structure according to yet another embodiment.

FIG. 6(a) shows a ring-shape ESD protection structure 50 according to one embodiment. The ESD protection structure 50 has a ring diode 52, as shown in FIG. 5, with an N+ 55 in an outer portion, a P+ 56 in an inner portion, and an intrinsic in a middle portion. The ESD protection structure 50 also has a ring diode 53, as shown in FIG. 5, with an N+ 57 in an outer portion, a P+ 58 in an inner portion, and an intrinsic in a middle portion. The N+ 55 of the diode ring 52 is coupled to VDD and the P+ 58 of the diode ring 53 is coupled to VSS. The P+ 56 of the diode 52 and the N+ 57 of the diode 53 are coupled to an I/O pad. For simplicity, the couplings through contacts, vias, or metals are not shown. The SBL layers in diodes 52 and 53 are also not shown.

Figure 6B:
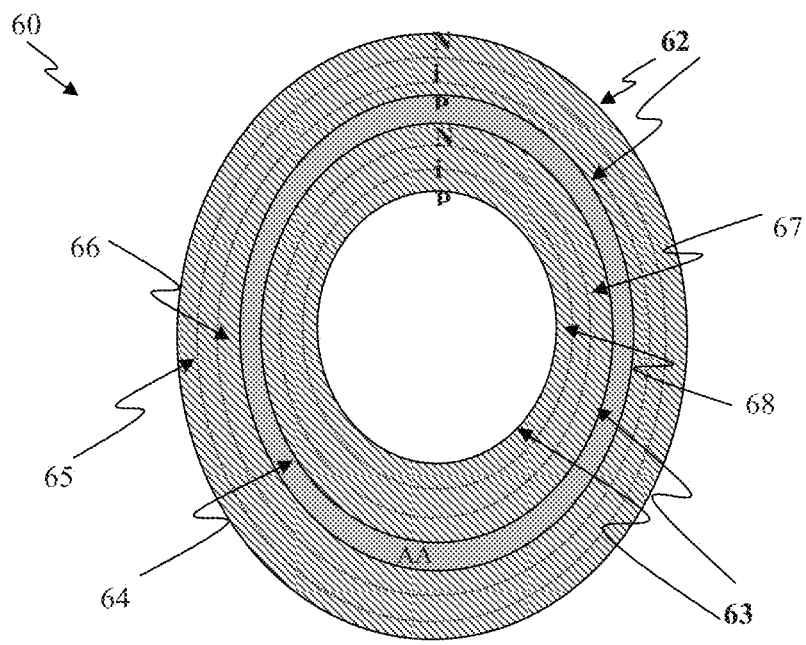

FIG. 6(b) shows a ring-shape ESD protection structure 60 according to one embodiment. The ESD protection structure 60 has a ring diode 62, as shown in FIG. 5, with an N+ 65 in an outer portion, a P+ 66 in an inner portion, and an intrinsic in a middle portion. The ESD protection structure 60 also has a ring diode 63, as shown in FIG. 5, with an N+ 67 in an outer portion, a P+ 68 in an inner portion, and an intrinsic in a middle portion. The two ring diodes 62 and 63 are separated by an active area 64. The N+ 65 of the ring diode 62 can be coupled to VDD and the P+ 68 of the ring diode 63 can be coupled to VSS. The P+ 66 of the diode 62, the N+ 67 of the diode 63, and the active area 64 can be coupled to an I/O pad. For simplicity, the couplings through contacts, vias, or metals are not shown. The SBL layers in the ring diodes 62 and 63 are also not shown. The active area 64 creates a short thermal path to substrate for the I/O pad.

Figure 6C:
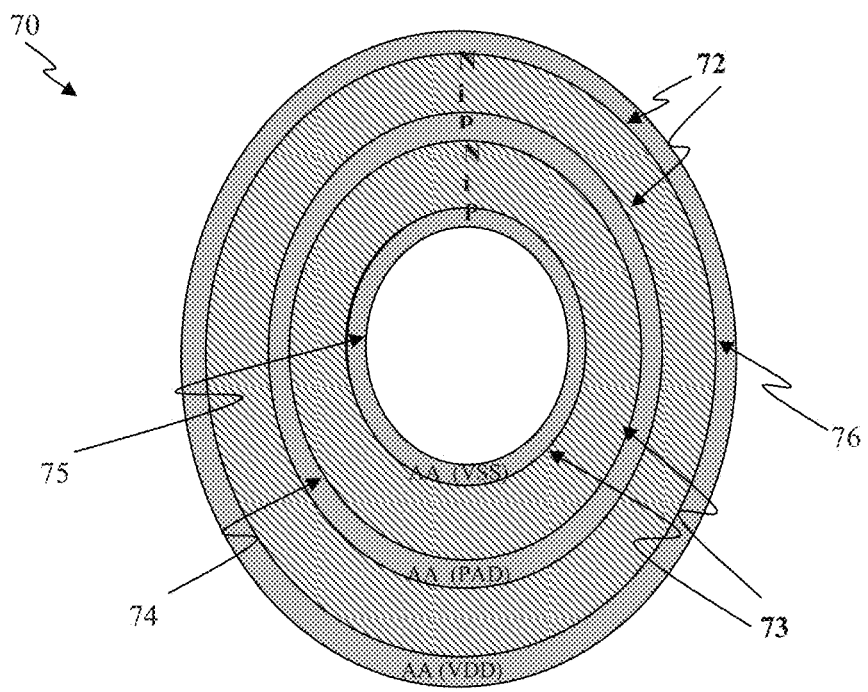

FIG. 6(c) shows a ring-shape ESD protection structure 70 according to one embodiment. The ESD protection structure 70 has a ring diode 72, as shown in FIG. 5, with an N+ in an outer region, a P+ in an inner region, and an intrinsic in a middle region. The ESD protection structure 70 also has a ring diode 73, as shown in FIG. 5, with an N+ in an outer region, a P+ in an inner region, and an intrinsic in a middle region. The two ring diodes 72 and 73 are separated by an active area 74 and surrounded by an active area 76 in the outer ring and an active area 75 in the inner ring. The N+ of the ring diode 72 can be coupled to VDD and the P+ of the ring diode 73 can be coupled to VSS. The P+ of the ring diode 72, the N+ of the ring diode 73, and the active area 74 can be coupled to an I/O pad. For simplicity, the couplings through contacts, vias, or metals are not shown. The SBL layers for ring diodes 72 and 73 are also not shown. The active areas 74, 75, and 76 create a short thermal path to substrate.

Figure 7:
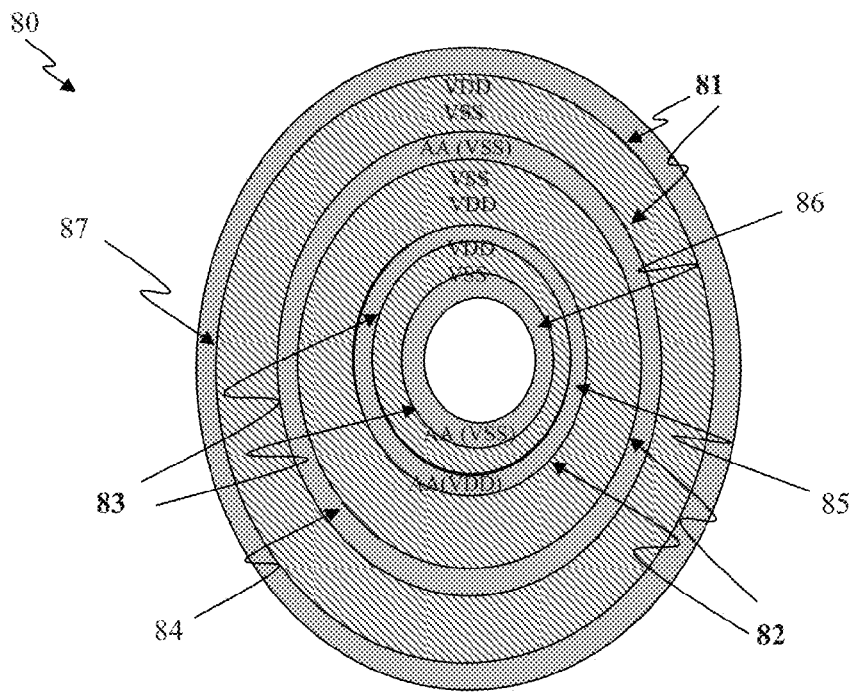
FIG. 7 shows a top view of a multiple ring-shape ESD protection structure according to one embodiment.

FIG. 7 shows a multiple ring-shape ESD protection structure 80 according to one embodiment. The ESD protection structure 80 has a ring-shape ESD structure 81, as shown in FIG. 6(a), 6(b), or 6(c), with an outer portion coupled to VDD and an inner coupled to VSS. The ESD protection structure 80 also has a ring-shape ESD structure 82, as shown in FIG. 6(a), 6(b), or 6(c), with an outer portion coupled to VSS and an inner portion coupled to VDD. The ESD protection structure 80 also has a ring-shape ESD structure 83, as shown in FIG. 6(a), 6(b), or 6(c), with an outer portion coupled to VDD and an inner portion coupled to VSS. The three ring-shape ESD structures 81, 82, and 83 are separated by an active area 84 and 85, and surrounded by an active area 87 in the outer portion and active area 86 in the inner portion. The active region 87 is coupled to VDD and the active region 86 is coupled to VSS. The active areas 84 and 85 are coupled to VSS and VDD, respectively. The I/O pad portions of the ring-shape ESD structures 81, 82, and 83 are coupled together to an I/O pad (not shown in FIG. 7). For simplicity, the couplings through contacts, vias, or metals are not shown. The N+, P+, and SBL layers of the ring-shape ESD structures 81, 82, and 83 are not shown either.

Figure 8:
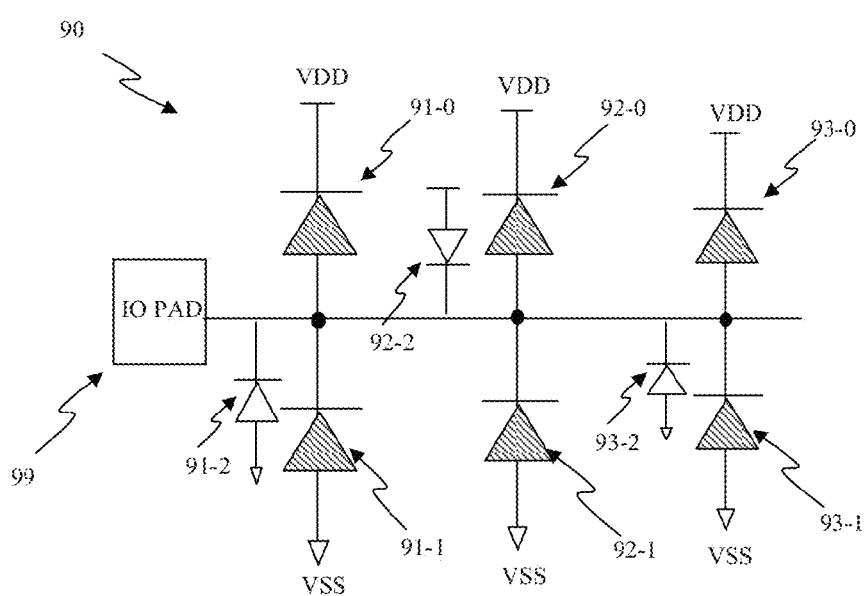
FIG. 8 shows an equivalent circuit of an ESD protection structure according to one embodiment.

FIG. 8 shows an equivalent circuit 90 of a multiple ring-shape ESD structure as shown in FIG. 7 according to one embodiment. The equivalent circuit 90 has an I/O pad 99 coupled to a junction diode 91-2, polysilicon/active-region/junction diodes 91-0 and 91-1; coupled to a junction diode 92-2, polysilicon/active-region/junction diodes 92-0 and 92-1; coupled to a junction diode 93-2, polysilicon/active region/junction diodes 93-0 and 93-1, of ring-shape structures such as 81, 82, and 83 in the FIG. 7, respectively. For better performance, the width of the smaller inner rings can be increased slightly so that each ESD rings have the same ESD protection thresholds. To save area, the ring-shape ESD structure can be comparable to the size of the I/O pad and/or be hidden under the I/O pad partially or wholly.

Semiconductor body on an insulated substrate can be used to construct switch devices such as Silicon Controlled Rectifier (SCR), DIAC, or TRIAC. The semiconductor body can be a polysilicon or active region body on an insulated substrate.

Figure 9A:
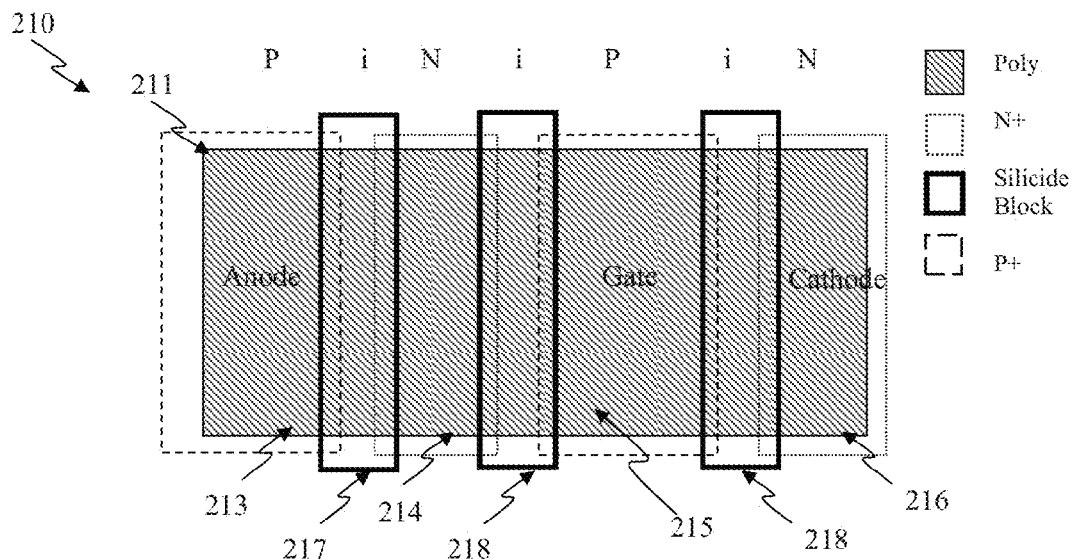
FIG. 9(a) shows a Silicon-Controlled Rectifier (SCR) device on a semiconductor body according to one embodiment.

FIG. 9(a) shows a top view of a SCR 210 constructed on a semiconductor body 211 according to one embodiment. The semiconductor body 211 has implant regions 213, 214, 215, and 216 by P+, N+, P+, and N+ implants, respectively. The N+ implant regions 214 and 216 and P+ implant regions 213 and 215 are separated with a space. Silicide block layers 217, 218, and 219 cover the spaces and overlap into both implant regions to construct P/N junctions in the interface. The regions with P+ implant 213, N+ implant 216, and P+ implant 215 are coupled, respectively, as the anode, cathode, and gate of a SCR, through contacts, vias, or metals (not shown in FIG. 9(a)).

Figure 9B:
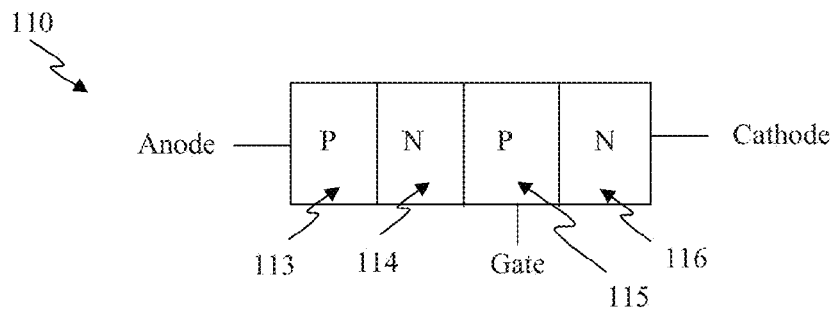
FIG. 9(b) shows an equivalent model of a SCR device according to one embodiment.

FIG. 9(b) shows an equivalent model of a SCR device 110 that has 4 layers of P+ and N+ regions, 113, 114, 115, and 116, alternatively, according to one embodiment. The external P+ and N+ regions 113 and 116 are brought out as the anode and cathode of an SCR. The internal P+ region 115 is brought out as the gate of an SCR.

Figure 9C:
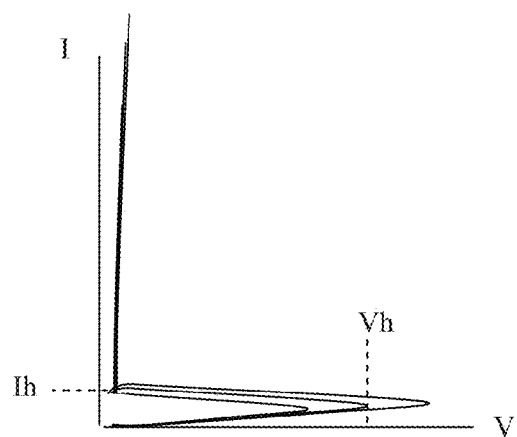
FIG. 9(c) shows a current versus voltage characteristic of an SCR device according to one embodiment.

FIG. 9(c) shows a current versus voltage characteristic of an SCR according to one embodiment. When a small voltage applied to an SCR, the SCR is not conductive. However, when the voltage is increased beyond Vh, the SCR suddenly becomes conductive and shows a low on-resistance state. Further, increasing the voltage makes the current higher and follows the on-resistance characteristics of the device. The Vh voltage can be controlled by a voltage applied to the gate as shown in the different curves in FIG. 9(c).

Figure 9D:
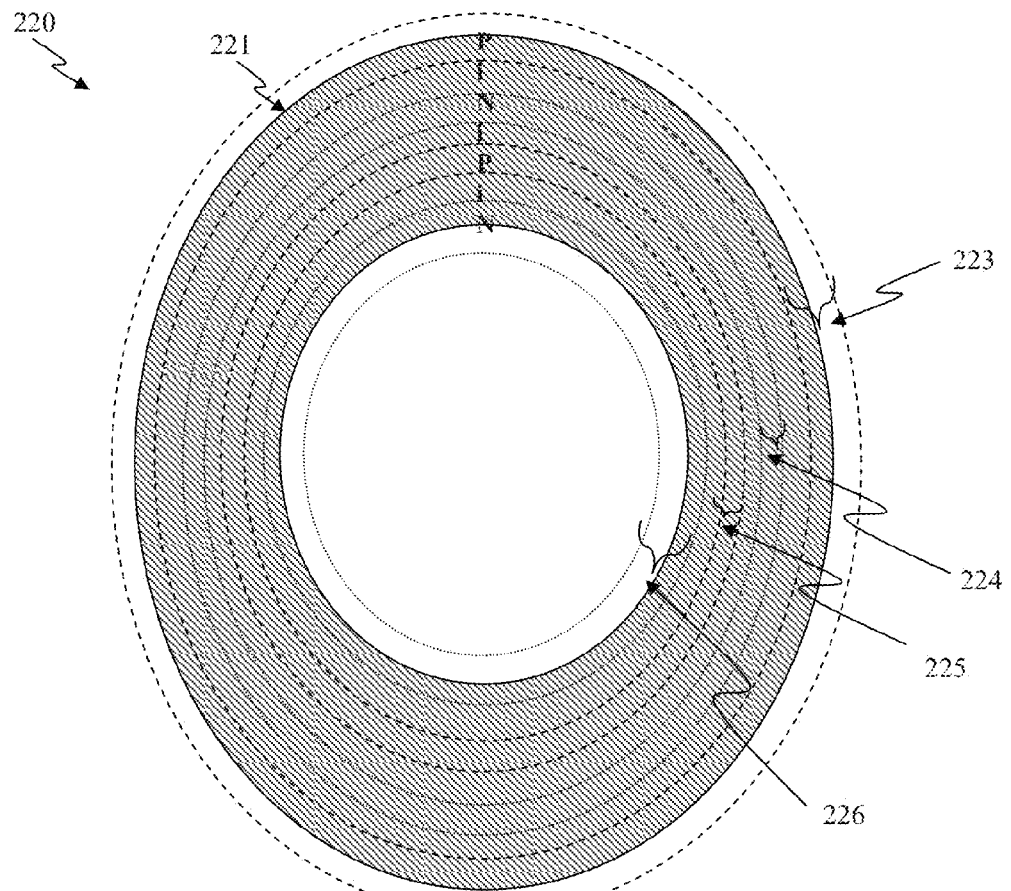
FIG. 9(d) shows a ring-shape SCR device constructed on a semiconductor body according to one embodiment.

FIG. 9(d) shows a top view of a ring-shape of SCR 220 constructed on a semiconductor body 221 according to one embodiment. The semiconductor body 221 has ring-shape implant regions 223, 224, 225, and 226 by P+, N+, P+, and N+ implants, respectively. The ring-shape N+ implant regions 224 and 226 and ring-shape P+ implant regions 223 and 225 are separated by a space. Silicide block layers (not shown in FIG. 9(d)) cover the spaces and overlap into both implant regions to construct P/N junctions in the interface. The regions with P+ implant 223, N+ implant 226, and P+ implant 225 are coupled respectively as the anode, cathode, and gate of a SCR, respectively, through contacts, vias, or metals (not shown in FIG. 9(d)).

Figure 10A:
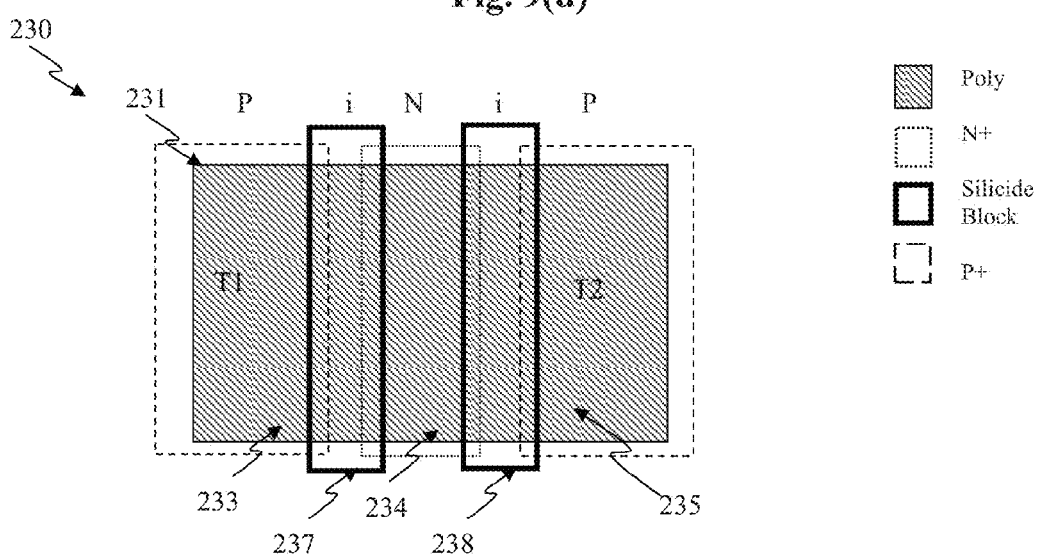
FIG. 10(a) shows a top view of a DIAC device constructed on a semiconductor body according to one embodiment.

FIG. 10(a) shows a top view of a DIAC 230 constructed on a semiconductor body 231 according to one embodiment. The semiconductor body 231 has implant regions 233, 234, and 235, covered by P+, N+, and P+ implants, respectively. The N+ implant regions 234 and the P+ implant regions 233 and 235 are separated with a space. Silicide block layers 237 and 238 cover the spaces and overlap into both implant regions to construct P/N junctions in the interface. The regions with P+ implant 233 and P+ implant 235 are coupled respectively as the anode, cathode, T1 and T2 of a DIAC, through contacts, vias, or metals (not shown in FIG. 10(a)).

Figure 10B:
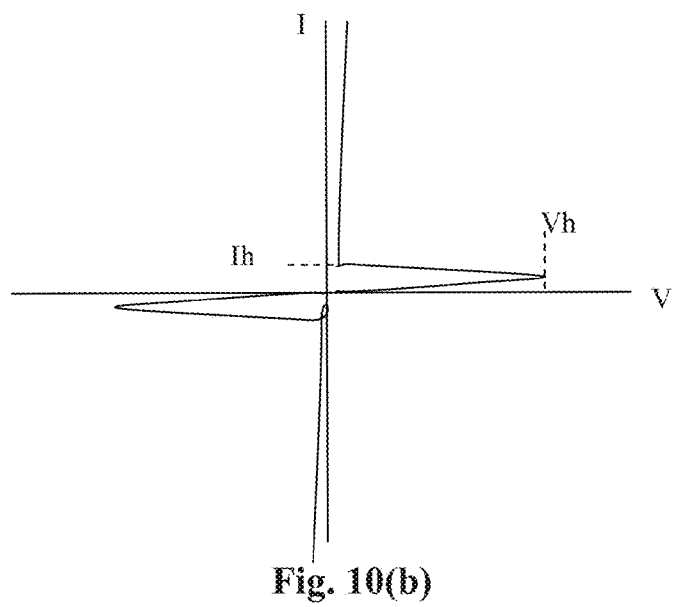
FIG. 10(b) shows a current versus voltage characteristic of a DIAC device according to one embodiment.

FIG. 10(b) shows a current versus voltage characteristic of the DIAC device 230 shown in FIG. 9(d), according to one embodiment. DIAC is a switch device similar to SCR, except that DIAC is a two-terminal device and does not have a gate terminal. When a voltage applied to the DIAC exceeds a critical voltage Vh, the DIAC becomes conductive. The DIAC shows the same characteristics with respect to a voltage applied in opposite polarity.

Figure 10C:
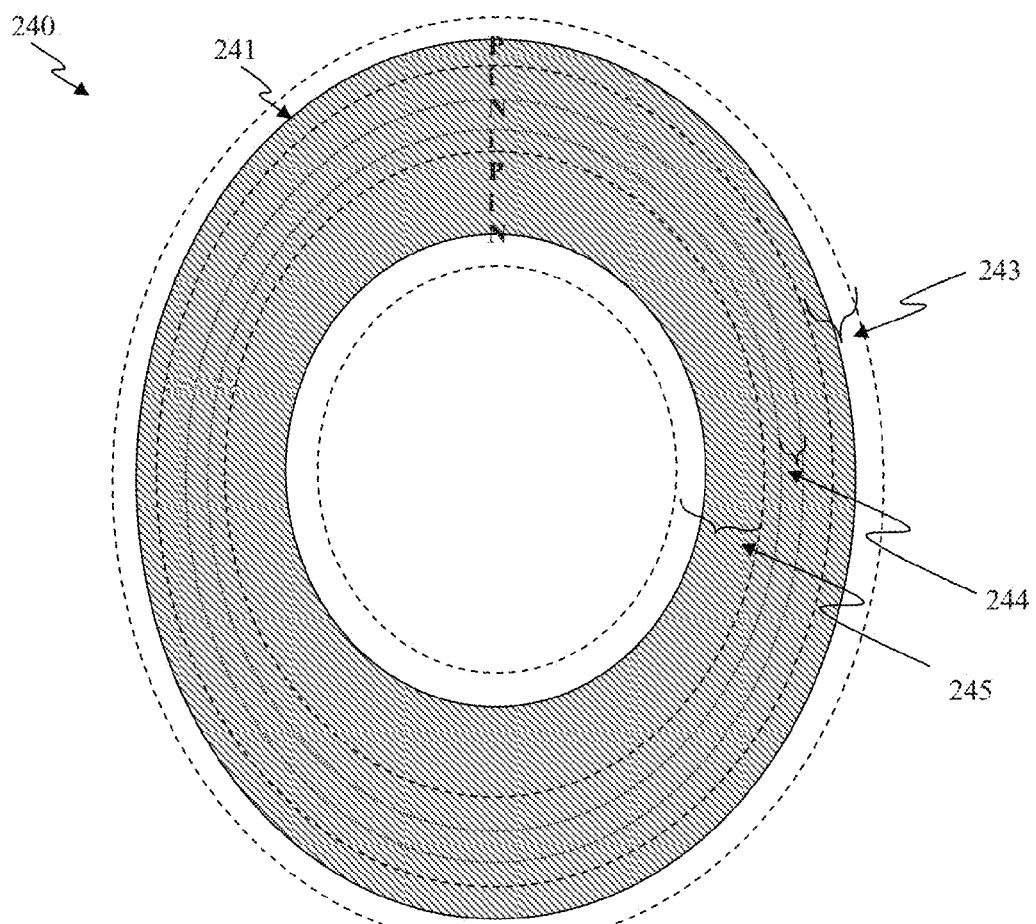
FIG. 10(c) shows a ring-shape DIAC device constructed on a semiconductor body according to one embodiment.

FIG. 10(c) shows a top view of a ring-shape of DIAC 240 constructed on a semiconductor body 241 according to one embodiment. The semiconductor body 241 has ring-shape implant regions 243, 244, and 245 by P+, N+, and P+ implants, respectively. The ring-shape N+ implant regions 244 and ring-shape P+ implant regions 243 and 245 are separated by spaces. Silicide block layers (not shown in FIG. 10(c)) cover the spaces and overlap into both implant regions to construct P/N junctions in the interface. The regions with P+ implant 243 and 245 are coupled respectively as the T1 and T2 of a DIAC, respectively, through contacts, vias, or metals (not shown in FIG. 10(c)).

Figure 11A:
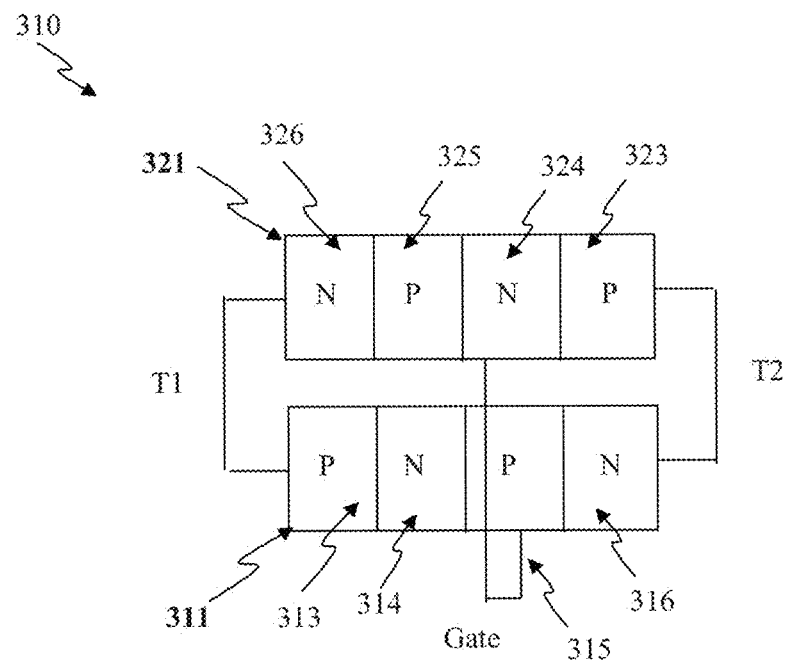
FIG. 11(a) shows an equivalent model of a TRIAC that can be readily embodied on a semiconductor body according to one embodiment.

FIG. 11(a) shows an equivalent model of a TRIAC 310 that has two coupled SCR structures 311 and 321 according to one embodiment. The SCR 311 has a P-N-P-N structure of 313, 313, 315, and 316, respectively. The SCR 321 also has a P-N-P-N structure of 323, 324, 325, and 326, respectively. The anode 313 of SCR 311 is coupled to the cathode of SCR 321 as a terminal T1 of the TRIAC 310. The cathode 316 of SCR 311 is coupled to the anode of SCR 323 as a terminal T2 of the TRIAC 310. The internal P+ 315 of SCR 311 and the internal N+ 324 of SCR 321 are coupled as a gate of the TRIAC 310. The TRIAC structure in FIG. 11(a) can be readily embodied on a semiconductor body using SCR structures shown in FIG. 9(a) and FIG. 9(d).

Figure 11B:
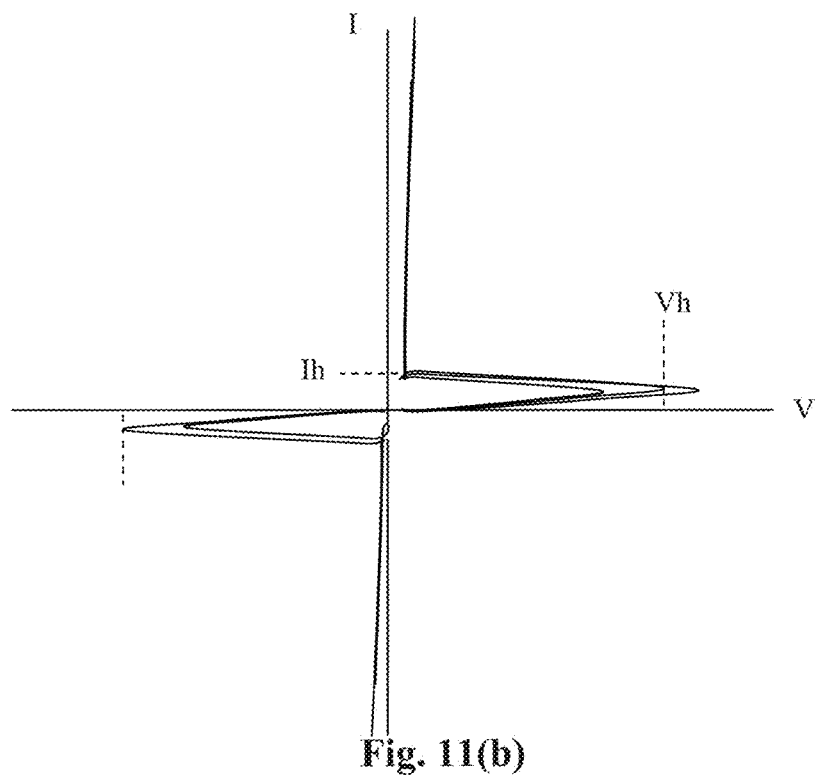
FIG. 11(b) shows a current versus voltage characteristic of a TRIAC device according to one embodiment.

FIG. 11(b) shows a current versus voltage characteristic of a TRIAC as shown in FIG. 310 according to one embodiment. The TRIAC characteristic is similar to the SCR except that the characteristic curves are symmetrical with respect to both voltage polarities.

Semiconductor body can be used to construct switch devices such as SCR, DIAC, or TRIAC based on P/N junctions built on the polysilicon or active region body on insulated substrate. The P/N junctions can be constructed from a gap between P+ and N+ implant regions and covered by a silicide block layer and overlapping into both implant regions. The dopant concentration in the gap can be not intentionally doped or slightly doped with N or P type to control the on-resistance. The DIAC, SCR, or TRIAC can be in any shape such as a circle, ring, rectangle, or polygon. The P+ and N+ implant regions in the above discussions are interchangeable. At least one of the P+ or N+ implant regions can be coupled to active areas and further coupled to a thermally conductive substrate. Those skilled in the art understand that the above discussions are for illustration purposes. There are many equivalent constructions and embodiments that can be applied and that are still within the scope of this invention.

The above discussions of various switch devices such as SCR, DIAC, or TRIAC based on a semiconductor body, or ESD structures based on ring-shape diodes are for illustration purposes. The semiconductor body can be on a conductive substrate through a dielectric, such as SiO2 on silicon substrate, or can be on a non-conductive substrate, such as mylar, plastic, glass, or paper, etc with a thin layer of semiconductor material coated on top. The substrate can be a film or a bulk. The ring-shape diodes for ESD structures can be a polysilicon, active region body on an insulated substrate, or junction diodes on a silicon substrate. For polysilicon or active-region diodes, the P+ and N+ implant regions can be separated with a gap. An SBL can cover the gap and overlap into the N+ and P+ regions. The width of the gap can be adjusted to change polysilicon or active region diodes' breakdown voltage. The doping concentration in the gap region can be changed to adjust the turn-on resistance. For junction diodes, the N+ and P+ active regions can be separated by LOCOS, STI, dummy gate, or SBL isolation. The N+ or P+ implant in the inner or outer ring is interchangeable. An active areas (AAs) can be introduced in any places to couple the diodes or switch devices to a thermally conductive substrate. The numbers of the supply voltages can be more than two, e.g., VDD and VSS. Those skilled in the art understand that there are many varieties and equivalent embodiments that are within the scope of this invention.

The invention can be implemented in a part or all of an integrated circuit in a Printed Circuit Board (PCB), or in a system. The ESD structures can comprise one or plural of ring-shape diode structures. Each ring-shape diode structure can comprise at least one ring-shape diodes with one terminal coupled to the I/O pad and the other terminal coupled to a supply voltage.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An electronic system including at least a switch device built on a semiconductor body, the switch device comprising:
   at least four regions in a portion of the semiconductor body, the first and the third regions being implanted with a first type of dopant, the second the fourth regions being implanted with a second type of dopant, and the regions being adjacent are separated by spaces; and
   a silicide block layer (SBL) covering the spaces and overlapping into both implant regions to construct P/N junctions between the first/second and second/third regions,
   wherein the first and third implant regions are conductive when a sufficiently high voltage is applied between the first and third implant regions,
   wherein the first, fourth, and third regions are served as the anode, cathode, and gate of a first Silicon-Controlled Rectifier (SCR),
   wherein the switch device further comprises a second SCR built on the semiconductor body having the opposite type of implants as in the first, second, third and fourth regions of the first SCR; and
   wherein the first, fourth, and third regions of the first and second SCRs are coupled, respectively, to serve as the first, second and gate terminals of a TRIAC, respectively.

2. An electronic system as recited in claim 1, wherein the semiconductor body is a polysilicon or active region on an insulated substrate.

3. An electronic system as recited in claim 1, wherein the spaces between the adjacent regions are substantially close to a minimum channel length of a CMOS technology.

4. An electronic system as recited in claim 1, wherein the spaces between the adjacent regions and/or the SBL overlapping area can be adjusted to control the turn-on voltage and/or the current of the triggering.

5. An electronic system as recited in claim 1, wherein at least one of the regions has a polygon configuration.

6. An electronic system as recited in claim 1, wherein at least one of the regions has a rectangle or square configuration.

7. An electronic system as recited in claim 1, wherein at least one of the regions has a ring-shape structure.

8. An electronic system as recited in claim 1, wherein at least one of the regions is coupled to an active area that is further coupled to a thermally conductive substrate.

9. An electronic system as recited in claim 1, wherein the fourth region has a P/N junction built in the interface of the third implant region.

10. An electronic system as recited in claim 9, wherein the switch device is a horizontally formed device in or on the semiconductor body.

11. An electronic system, comprising:
    at least one integrated circuit, the integrated circuit including at least one switch device on an isolated semiconductor body, the switch device including at least:
       at least four implant regions provided on a portion of the isolated semiconductor body, the first and third implant regions being with a first type of implant, the second and fourth implant regions being with a second type of implant, and the implant regions being adjacent are separated by at least one space; and
       at least one silicide block layer (SBL) covering the at least one space and overlapping into the adjacent implant regions to construct P/N junctions in first/second and second/third implant regions,
    wherein a plurality of the four implant regions serve as a first Silicon-Controlled Rectifier (SCR),
    wherein a second SCR built on the isolated semiconductor body has the opposite type of implants in the first, second, third and fourth implant regions as in the first SCR, and
    wherein the first and second SCRs are coupled to form a TRIAC.

12. An electronic system as recited in claim 11, wherein the first and third implant regions respectively serve as a first and second terminals of the switch device.

13. An electronic system as recited in claim 11, wherein the isolated semiconductor body is a polysilicon or active region on an insulated substrate.

14. An electronic system as recited in claim 11, wherein the at least one space between the adjacent implant regions and/or the SBL overlapping can be adjusted to control the turn-on voltage and/or the current of the switch device.

15. An electronic system as recited in claim 11, wherein at least one of the implant regions is a rectangle, square, or ring-shape structure.

16. An electronic system as recited in claim 11, wherein at least one of the implant regions is coupled to an active area that is further coupled to a thermally conductive substrate.

17. An electronic system as recited in claim 11, wherein the fourth implant region has a P/N junction built in the interface of the third implant region.

18. An electronic system comprising:
at least one integrated circuit, the integrated circuit including at least one switch device on an isolated semiconductor body, the switch device including at least:
at least three implant regions provided on a portion of the isolated semiconductor body, the first and third implant regions being with a first type of implant, the second implant region being with a second type of implant, and the implant regions being adjacent are separated by at least one space; and
at least one silicide block layer (SBL) covering the at least one space and overlapping into the adjacent implant regions to construct P/N junctions in first/second and second/third implant regions,
wherein the switch device further comprises a fourth implant region that has a second type of implant, the fourth implant region has a P/N junction built in the interface of the third implant region, the first, fourth, and third implant regions are served as the anode, cathode, and gate of a first Silicon-Controlled Rectifier (SCR), and
wherein a second SCR built on the same semiconductor body has the opposite type of implants in the first, second, third, and fourth implant regions to the first SCR, and the first, fourth, and third regions of the first and second SCRs are coupled, respectively, to serve as the first, second, and gate terminals of a TRIAC, respectively.

19. An integrated circuit including at least one switch device on an isolated semiconductor body, the switch device comprising:
at least four implant regions provided on a portion of the isolated semiconductor body, the first and third implant regions being with a first type of implant, the second and fourth implant regions being with a second type of implant, and the implant regions being adjacent are separated by at least one space; and
at least one silicide block layer (SBL) covering the at least one space and overlapping into the adjacent implant regions to construct P/N junctions in first/second and second/third implant regions,
wherein the fourth implant region has a P/N junction built in the interface of the third implant region,
wherein the first, fourth and third implant regions serve as the anode, cathode and gate of a first Silicon-Controlled Rectifier (SCR),
wherein a second SCR built on the isolated semiconductor body has the opposite type of implants as in the first, second, third and fourth implant regions of the first SCR, and
wherein the first and second SCRs are coupled to serve as a TRIAC.

20. An integrated circuit as recited in claim 19,
wherein the at least one space between the adjacent implant regions and/or the SBL overlapping can be adjusted to control the turn-on voltage and/or the current of the switch device, and
wherein at least one of the implant regions is coupled to an active area that is further coupled to a thermally conductive substrate.

21. An integrated circuit as recited in claim 20, wherein at least one of the implant regions is a rectangle, square, or ring-shape structure.

22. An integrated circuit as recited in claim 21,
wherein the switch device further comprises a fourth implant region that has a second type of implant, the fourth implant region has a P/N junction built in the interface of the third implant region, the first, fourth, and third implant regions are served as the anode, cathode, and gate of a Silicon-Controlled Rectifier (SCR), and
wherein a second SCR built on the same semiconductor body has the opposite type of implants in the first, second, third, and fourth implant regions to the first SCR, and the first, fourth, and third regions of the first and second SCRs are coupled, respectively, to serve as the first, second, and gate terminals of the switch device.

23. An integrated circuit as recited in claim 19, wherein the at least one switch device provides at least one horizontally formed device in or on the isolated semiconductor body and provides horizontal Electro-Static Discharge (ESD) protection.

24. An integrated circuit as recited in claim 19, wherein the first, fourth, and third regions of the first and second SCRs are coupled, respectively, to serve as the first, second, and gate terminals of the TRIAC, respectively.

25. An electronic system as recited in claim 11, wherein the switch device is a horizontally formed device in or on the isolated semiconductor body and provides horizontal Electro-Static Discharge (ESD) protection.

* * * * *